US006661250B2

(12) United States Patent
Kim et al.

(10) Patent No.: US 6,661,250 B2
(45) Date of Patent: Dec. 9, 2003

(54) PROGRAMMABLE IMPEDANCE CONTROL CIRCUIT

(75) Inventors: Nam-Seog Kim, Seoul (KR); Uk-Rae Cho, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/357,841

(22) Filed: Feb. 4, 2003

(65) Prior Publication Data

US 2003/0116810 A1 Jun. 26, 2003

Related U.S. Application Data

(62) Division of application No. 09/905,360, filed on Jul. 13, 2001, now Pat. No. 6,525,558.

(30) Foreign Application Priority Data

Nov. 27, 2000 (KR) ........................................ 2000-70879

(51) Int. Cl.[7] .............................................. H03K 17/16
(52) U.S. Cl. .............................. 326/30; 326/83; 327/108
(58) Field of Search .............................. 326/30, 83, 86; 327/108, 109

(56) References Cited

U.S. PATENT DOCUMENTS 6,307,791 B1 * 10/2001 Otsuka et al. ......... 365/189.05

* cited by examiner

*Primary Examiner*—Daniel Chang
(74) *Attorney, Agent, or Firm*—F. Chau & Associates, LLC

(57) ABSTRACT

Disclosed is a programmable impedance control circuit, comprising a voltage divider, the voltage divider comprising an MOS array supplied with a first voltage and an external resistance having an external impedance equal to N times said external resistance. The voltage divider outputs a second voltage. A reference voltage generator is provided for generating a third voltage corresponding to N/(N+M) times said first voltage as a reference voltage for said second voltage, and wherein M times internal impedance is used for N times external impedance (N=M or N≠M).

11 Claims, 7 Drawing Sheets

PROGRAMMABLE IMPEDANCE CONTROL CIRCUIT

This application is a divisional of U.S. application Ser. No. 09/905,360 filed on Jul. 13, 2001, now U.S. Pat. No. 6,525,558 B2, the disclosure of which is incorporated by reference herein in its entirety.

BACKGROUND OF THE INVENTION

1. Field of the Invention

The present invention relates to a programmable impedance control circuit and more particularly to a programmable impedance control circuit that produces an internal impedance related to an external impedance.

2. Description of the Related Art

Recently, methods of combining on-chip parallel termination with series termination have been proposed for high speed data transmission (HSDT) applications. Parallel terminations exhibit superior signal integrity than series terminations, but consume more power. In on-chip terminated HSDT applications, full swing data is typically transmitted through a transmission line wherein an output driver acts as a source termination and a receiver acts as a parallel termination. In such a method, the swing level of the signal may be lowered. To implement on-chip termination, a matching resistor should be added to the output driver. However, because the output driver and the on-chip termination are disposed within a chip and characteristic impedance varies depending upon operating conditions, it is difficult to properly terminate with matching impedance with a fixed resistance.

Thus, it would be desirable to be able to program or adjust the impedance in such HSDT circuits, such as by a programmable impedance control circuit that can transmit information to an output driver and an on-chip termination by detecting an external resistance value. Such a programmable impedance control circuit matches impedance corresponding to an external resistance value when a user electrically connects the system to the external resistance, and also matches an internal impedance to an external impedance by actively updating a digital signal into a predetermined period in response to changes in voltage and temperature (hereinafter referred to as a VT change).

A conventional method of programmable impedance control allows a user to connect an external resistive device to a pin on a chip. The resistive device has a multiple predetermined resistance value, one of which is selected upon detection in the chip of voltage values, and a corresponding multiple times driver operated. The driver will usually be an array of MOS transistors, the impedance of the array varying with the number of transistors activated. For example, if an external resistance of ×5 is used (five times a predetermined resistance value), a MOS array driver will be activated to deliver the same impedance.

HSDT systems that require both series and parallel terminations, however, will require different impedances. For example, if an external resistance is ×5, a driver may require ×1 impedance, and a termination may require ×2 impedance. Another problem is that there may be mismatch errors in the measurement of the external impedance by the controller, because at high frequencies the external resistance may differ from the external impedance.

SUMMARY OF THE INVENTION

Disclosed is a programmable impedance control circuit, comprising an MOS array supplied with a first voltage; an external resistance having an external impedance equal to N times said external resistance; a pad outputting a second voltage obtained by combination of said MOS array and said external resistance; a reference voltage generator for generating a third voltage corresponding to N/(N+M) times said first voltage as a reference voltage for said second voltage; and wherein M times internal impedance is used for N times external impedance (N=M or N≠M).

In another aspect of the invention, the reference generator outputs the third voltage from between a first resistance connected to the first voltage and a second resistance connected to ground and the ratio of the first resistance to the second resistance is equal to M to N.

In another aspect of the invention, the programmable impedance control circuit further comprises a detector; said detector adapted to detect an impedance corresponding to a reference voltage for the external resistance and output a feedback signal to the MOS array.

In another aspect of the invention, the detector generates a signal corresponding to an impedance of a reference voltage for an external resistance to output it and at the same time to feedback the signal to the MOS array.

In another aspect of the invention) the detector produces a current corresponding to an impedance of a reference voltage for an external resistance to output it and at the same time to feedback the current to the MOS array.

In another aspect of the invention, the MOS array is constructed with a plurality of PMOSs and turn on an additionally adjacent PMOS when the turned-on PMOS gate voltage reaches a drain voltage.

In another aspect of the invention, the MOS array includes a capacitance inserted between a gate and a source of the PMOSs.

In another aspect of the invention, the output of the pad and the detector are provided therebetween with a low-pass filter.

In another aspect of the invention, the programmable impedance control circuit comprises a pull-up circuit outputting a signal in response to a pull-up and a pull-down circuit outputting a signal in response to a pull down; wherein the circuit thereby feeds back the signal corresponding to the impedance generated by the detector of the pull-up circuit to produce a signal corresponding to an impedance of the detector of the pull-down circuit.

In another aspect of the invention, the programmable impedance control circuit comprises a pull-up circuit outputting a current in response to a pull-up and a pull-down circuit outputting a current in response to a pull down; wherein the circuit thereby feeds back the current corresponding to the impedance generated by the detector of the pull-up circuit to produce a current corresponding to an impedance of the detector of the pull-down circuit.

In another aspect of the invention, the programmable impedance control circuit includes a current mirror to reduce the up/down mismatch of the pull-up circuit and the pull-down circuit.

Disclosed is a programmable impedance control circuit using an M times internal impedance for an N times external impedance (N≠M), comprising a pull-up circuit comprising a MOS array being supplied with a first voltage, an external resistance having an N times external impedance, a pad outputting a second voltage obtained in combination of the first MOS array and the external resistance, a first reference generator for generating a first reference voltage corresponding to N/(N+M) times of the first voltage as a first reference voltage for the second voltage outputted from the pad, a first comparator for comparing the second voltage with the first reference voltage to output an impedance in compliance the first reference voltage for the second voltage, and a first counter for generating a signal corresponding to the impedance outputted from the first comparator to output it to an up-driver and tip-terminator and at the same time feeding back it to the first MOS array; and a pull-down circuit comprising a second MOS array being supplied with a first voltage and receiving a signal outputted from the first counter to control an impedance, a third MOS array connected to the second MOS array at one terminal and connected to ground at the other terminal, a second comparator for comparing the third voltage obtained by combination of the second MOS array and the third MOS array with the second reference voltage that is a half of the first voltage to output an impedance in compliance the second reference voltage for the third voltage, and a second counter for generating a signal corresponding to the impedance outputted from the second comparator to output it to a down-driver and down-terminator and at the same time feeding back it to the third MOS array.

In another aspect of the invention, the output of the pad and the first comparator are provided therebetween with a low-pass filter, and the first reference generator and the first comparator are provided therebetween with a low-pass filter.

In another aspect of the invention, the first reference generator outputs the first reference voltage from between a first resistance connected to the first voltage and a second resistance connected to ground, wherein the ratio of the first resistance and the second resistance is M to N.

Disclosed is a programmable impedance control circuit using an M times internal impedance for an N times external impedance (N≠M), comprising a pull-up circuit comprising a PMOS current source being supplied with a first voltage or second voltage, an external resistance having an N times external impedance, a pad outputting a third voltage obtained in combination of the PMOS current source and the external resistance, a first reference generator for generating a fourth reference voltage corresponding to N/(N+M) times of the first voltage as a first reference voltage for the third voltage outputted from the pad, a first comparator for comparing the third voltage with the fourth voltage that is the first reference voltage to output an impedance in compliance the first reference voltage for the third voltage as an current to output it and at the same time feeding back it to the PMOS, a current mirror for copying the current from the first comparator, a second comparator for comparing the output voltage from the current mirror with the second reference voltage that is a half of the first voltage to output it, and a first counter for generating a signal corresponding to the impedance outputted from the second comparator to output it to an up-driver and up-terminator and at the same time feeding back it to the first MOS array; and a pull-down circuit comprising a second MOS array being supplied with a first voltage, an NMOS array connected to the second MOS array at one terminal and connected to ground at the other terminal, a third comparator for comparing the fifth voltage obtained by combination of the second MOS array and the NMOS array with the second reference voltage to output an impedance in compliance the second reference voltage for the fifth voltage, and a second counter for generating a signal corresponding to the impedance outputted from the third comparator to output it to a down-driver and down-terminator and at the same time feeding it back to the second MOS array.

In another aspect of the invention, the output of the pad and the first comparator are provided therebetween with a low-pass filter, and the first reference generator and the first comparator are provided therebetween with a low-pass filter.

In another aspect of the invention, the first reference generator outputs the fourth voltage from between a first resistance connected to the first voltage and a second resistance connected to ground, wherein the ratio of the first resistance and the second resistance is M to N.

In another aspect of the invention, the current source comprises a plurality of PMOSs and turns on an additionally adjacent PMOS when the gate voltage of the turned-on PMOS reaches a drain voltage, thereby extending the operational scope.

In another aspect of the invention, the current source is provided therein with a capacitor inserted between the gate and source of the each of the PMOSs.

Disclosed is a programmable impedance control circuit, comprising:
  a voltage divider, comprising:
    MOS array supplied with a first voltage; and
    an external resistance having an external impedance equal to N times said external resistance;
    said voltage divider outputting a second voltage;
    a reference voltage generator adapted to generate a third voltage corresponding to N/(N+M) times said first voltage as a reference voltage for said second voltage; and
    wherein M times internal impedance is used for N times external impedance (N=M or N≠M).

DETAILED DESCRIPTION OF PREFERRED EMBODIMENTS

Figure 1:
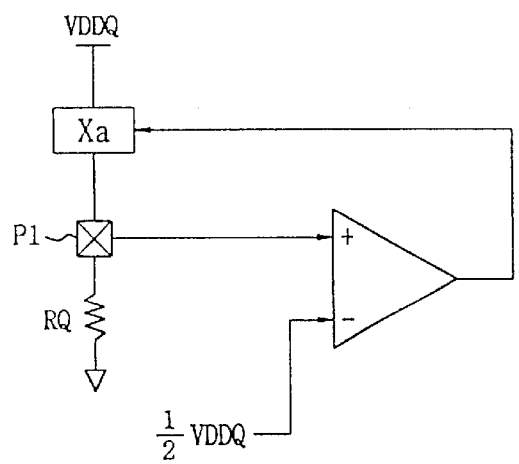
FIG. 1 is a schematic of a programmable impedance control circuit according to a compared example 1.
Figure 2:
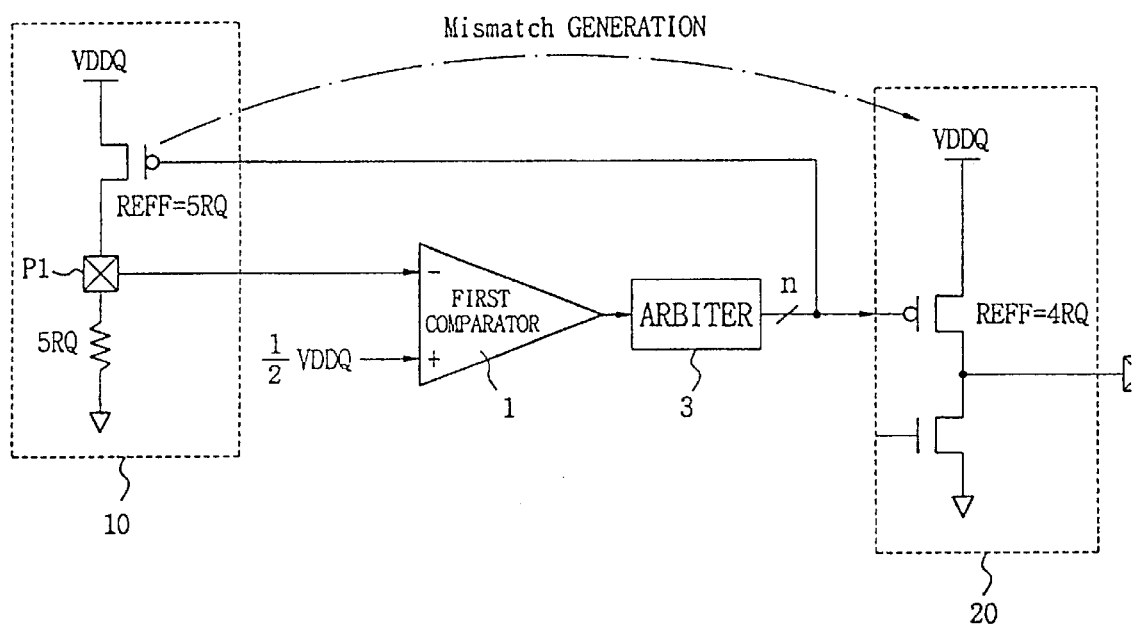
FIG. 2 is a schematic of a programmable impedance control circuit employing a reference voltage VDDQ/2 according to a compared example 2.

Before describing the preferred embodiments of the invention, it will be useful to describe, with reference to FIGS. 1 and 2, a conventional programmable impedance control circuit.

Conventional System

Referring to FIG. 1, a conventional programmable impedance control circuit functions to match an external impedance RQ and an internal impedance Xa by using VDDQ/2, which is half of the High Speed Transceiver Logic Voltage (hereinafter referred to as VDDQ), as a reference voltage to generate the same impedance as the external resistance RQ.

FIG. 2 shows a conventional system of generating two different impedances, REFF=5RQ and REFF=4RQ, in response to an external impedance 5RQ. In the example shown, the first impedance REFF=5RQ will be identical to the external load 5RQ, while a second impedance REFF=4RQ will be provided that is only 4/5 the magnitude of the external impedance. This is done by providing a second set of transistors 20 that has a 5/4 ratio as compared to the size of the first transistor 10, but there is a possibility that mismatching can result from the difference in transistor size. In addition, because the circuit generates only one extra termination impedance, the circuit could not provide portions such as output buffer DQ, control, address, and clock pin, etc., which need various impedances. One reason for this limitation is that the circuit employs a fixed reference voltage VDDQ/2. In order to solve such a problem, the present invention provides a programmable impedance control circuit for generating an optional internal impedance necessary to meet various external impedances.

Preferred Embodiments

Hereinafter, the preferred embodiments will be explained below with reference to the accompanying drawings.

Figure 3:
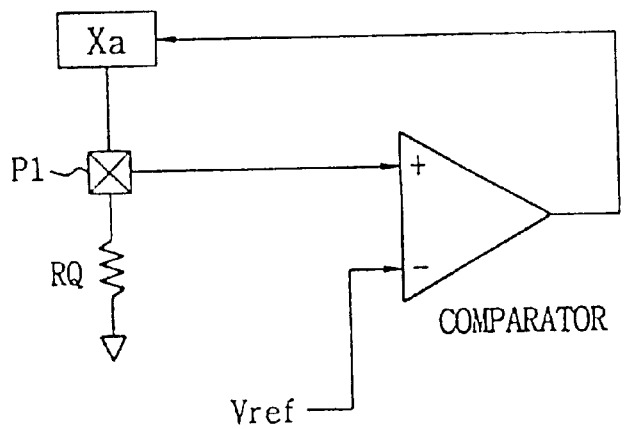
FIG. 3 is a schematic of a programmable impedance control circuit employing an optional reference voltage as a reference voltage according to the present invention.

Referring to FIG. 3 there is shown an embodiment of a basic programmable impedance control circuit in which a variable reference voltage Vref as a reference voltage is employed. The circuit employs any reference voltage Vref for an output voltage of a pad P1 obtained from the voltage dividing combination of Xa and an external resistance RQ. For example, when an external resistance RQ has an impedance "×N", the internal resistance "×5" may be generated by employing the [N/(N+M)]VDDQ voltage within the limitation maintaining the linearity of MOS array. That is, the circuit of the present invention can generate an internal impedance "×M" at Xa even though the external resistance is "RQ=×N".

Figure 4:
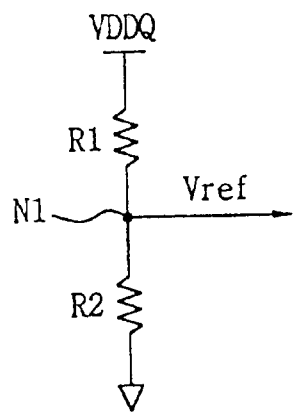
FIG. 4 is a schematic of an optional reference voltage generating circuit according to the present invention.

Referring to FIG. 4, there is shown a schematic of an embodiment of a reference voltage generator according to the present invention. There are other ways of generating a reference voltage Vref for use in the circuit of FIG. 3, but this schematic shows one of the simplest. Resistances R1 and R2 are connected in series between the VDDQ and ground so as to form a voltage divider, and the reference voltage Vref is generated therefrom at node N1. For example, when the internal impedance is changed to "×M" to meet the external impedance "×N", it is realized with the ratio "R1:R2=M:N" as shown in FIG. 4. In addition, the method may employ a power compensation circuit to maintain the ratio M:N regardless of changes in process, voltage, and temperature conditions.

Figure 5A:
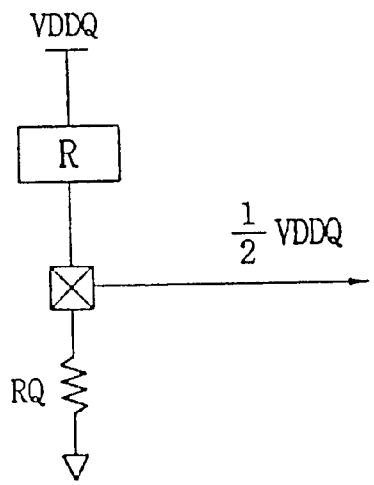
FIG. 5a is a schematic of a resistance setting method for generating a reference voltage VDDQ/2.
Figure 5B:
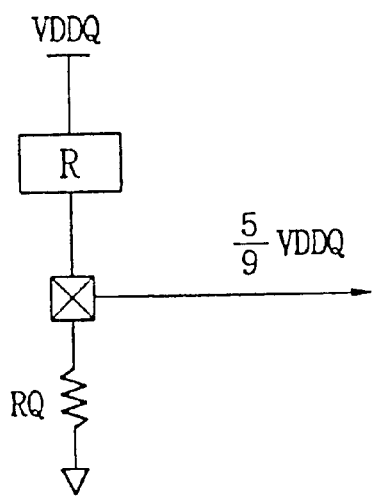
FIG. 5b is a schematic of a resistance setting method for generating an optional reference voltage.

FIGS. 5a and 5b compare the conventional method and a method of the invention for generating reference voltages using resistances. FIG. 5a shows a conventional resistance setting method using the typical reference voltage "VDDQ/2", and FIG. 5b shows the inventive resistance setting method that generates any desired reference voltage, in this case (5/9)VDDQ. In the conventional method in FIG. 5a, the resistance block R connected to the VDDQ equals RQ, that is, R=RQ, in order to output the voltage VDDQ/2 in response to the external resistance RQ. This results from the following formulas 1:

$$VDDQ/2 = VDDQ[RQ/(R+RQ)], \tag{1a}$$

$$\text{therefore, } R = RQ \tag{1b}$$

However, in the resistance setting method for generating a reference voltage according to the present invention as shown in FIG. 5b, the voltage "5VDDQ/9" is obtained by the following formulas 2:

Formula 2:

$$5\,VDDQ/9 = VDDQ[(RQ)/(R+RQ)], \tag{2a}$$

$$\text{therefore, } R = (4/5)RQ \tag{2b}$$

In such a way, any required internal impedance can be generated by setting a resistance value to generate an optional reference voltage.

Figure 6A:
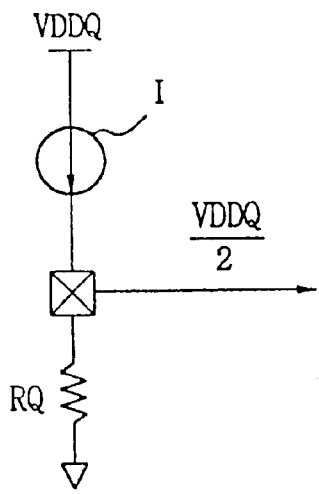
FIG. 6a is a schematic of a current setting method for generating a reference voltage VDDQ/2.
Figure 6B:
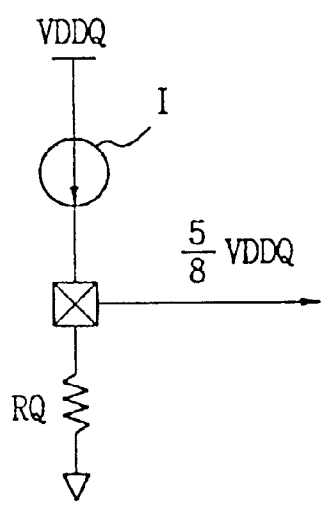
FIG. 6b is a schematic of a current setting method for generating an optional reference voltage.

FIGS. 6a and 6b compare the conventional and inventive methods of generating a reference voltage by controlling current, rather than resistance. FIG. 6a is a circuit diagram showing a current setting method for generating a reference voltage "VDDQ/2", and FIG. 6b is a circuit diagram showing a current setting method for generating any desired reference voltage, in this case 5VDDQ/8. In the current setting method in FIG. 6a, the current block I connected to the VDDQ outputs the voltage VDDQ/2 in response to the external resistance RQ. It results from the following formula 3:

$$VDDQ/2 = I \cdot Q, \tag{3a}$$

$$\text{therefore, } I = VDDQ/2RQ \tag{3b}$$

However, the current setting method for generating a reference voltage according to the present invention as shown in FIG. 6b obtains the voltage 5VDDQ/8 according to the following formula 4:

$$5VDDQ/8 = I \cdot RQ, \tag{4a}$$

$$\text{therefore, } I = 5/8(VDDQ)/(RQ) \tag{4b}$$

In such a way, the circuit of the present invention sets a current for generating an optional reference voltage to thereby generate the required internal impedance.

Figure 7:
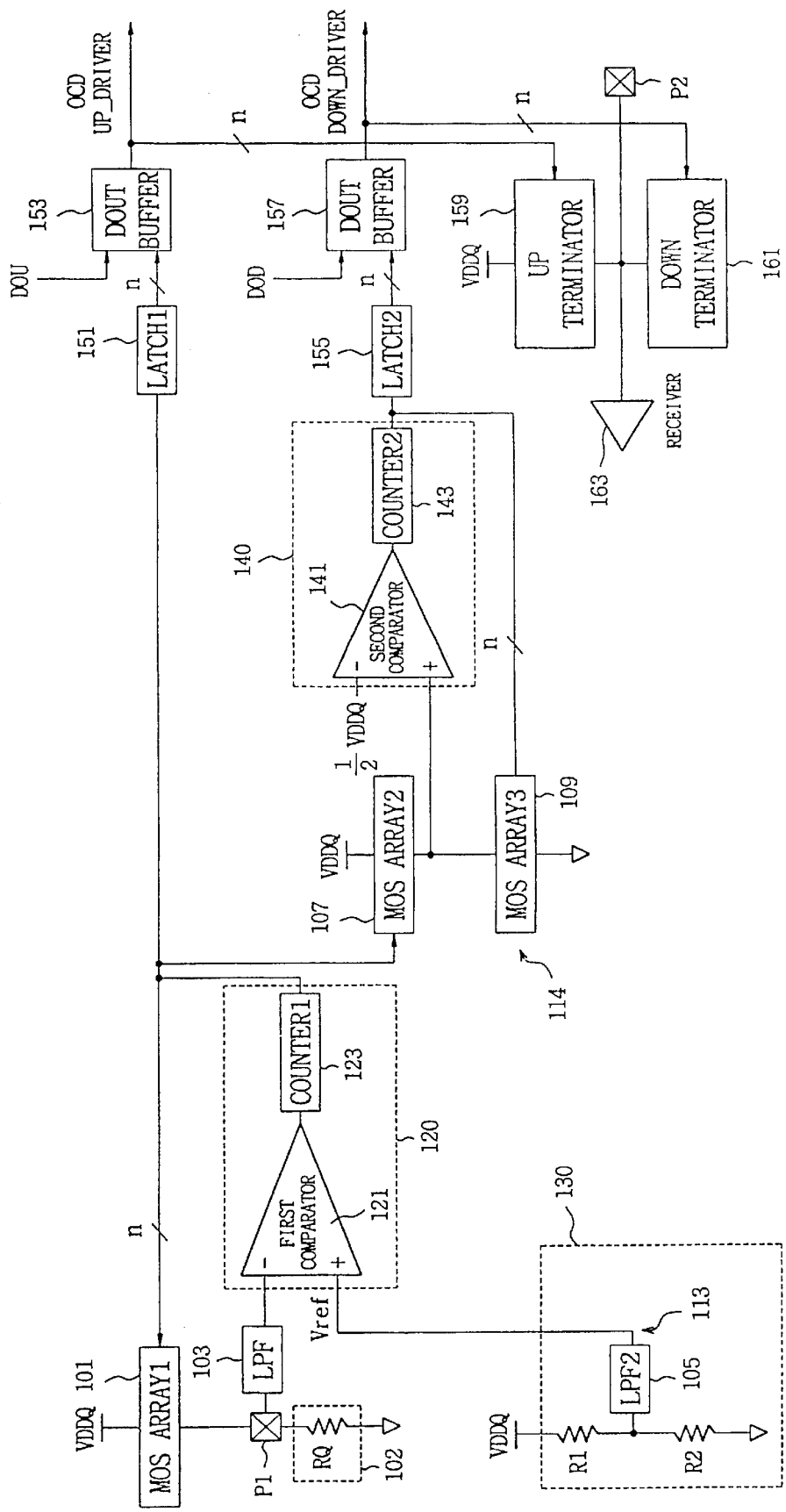
FIG. 7 is a schematic of a programmable impedance control circuit employing an optional reference voltage according to the first embodiment of the present invention.

Referring to FIG. 7, there is shown a schematic of a programmable impedance control circuit in which an optional reference voltage is employed according to a first embodiment of the present invention. The circuit comprises a pull-up circuit comprising a first MOS array 101 connected to VDDQ, a first pad P1, an external resistance 102 RQ, a low-pass filter LPF 103, a reference voltage generator 130, a first detector 120, a first latch 151, a first-data output buffer 153, an off-chip tip-driver OCD UP_DRIVER, and an up-terminator 159.

Also provided is a pull-down circuit comprising a second MOS array 107, a third MOS array 109, a second detector 140, a second latch 155, a second data output buffer 157, an off-chip down-driver OCD DOWN-DRIVER and a down-terminator 161.

The circuit uses M times internal impedance (N≠M) in accordance with N times the external impedance RQ attached to the system by the user. Its operation is as follows:

First, the first MOS array 101 in the pull-up circuit is supplied with the VDDQ power, such as a high speed transceiver logic (HSTL) power. The external resistance RQ 102 is N times the external impedance. The pad P1 outputs a second voltage obtained by combination of the first MOS array 101 and the external resistance RQ 102. The first reference voltage generator 130 generates a first reference voltage Vref equal to VDDQ*N/(N+M), wherein R2 has N resistance and R1 has M resistance. The first comparator 121 and the first counter 123 are included in the first detector 120, the first comparator 121 compares the low-pass filtered voltage at P1 with the first reference voltage and outputs the result to the first counter 123. The first counter 123 generates a signal corresponding to the output of the first comparator 121 to output it to the up-driver and up-terminator 159 of the off-chip driver (OCD) and at the same time to feed it back to the first MOS array 101.

In the pull-down circuit, the second MOS array 107 has the same structure as the first MOS array 101, also supplied with the VDDQ voltage, and receives the output from the first counter 123 to control an impedance. Hence, the first counter 123 is controlling both the first 101 and second 107 MOS arrays. The third MOS array 109 is connected to the second MOS array 107 in a voltage divider configuration, thereby determining a third voltage between them. The second detector 140 is provided with the second comparator 141 and second counter 143. The second comparator 141 compares the third voltage obtained by combination of the second MOS array 107 and the third MOS array 109 with the second reference voltage VDDQ/2 that is preferably set at half of the VDDQ voltage so as to output an impedance corresponding to the VDDQ/2 voltage for the third voltage. The second counter 143 receives the output of the second comparator 141 and generates a feedback signal to the third MOS array 109.

Optional first and second low-pass filters (LPF) 103, 105 are connected between the output of pad P1 and first comparator 121 and between the first reference voltage generator 130 and the first comparator 121, thereby reducing noises generated from the pad P1 and leveling up the noise characteristics. The two LPFs 103 and 105 may be a same type or not be the same type. The first reference voltage generator 130 generates the first reference voltage from between the first resistance R1 connected to the VDDQ voltage and the second resistance R2 connected to ground. The ratio of the first resistance R1 and second resistance R2 is M:N.

In the circuit, the first detector 120 comprising the first comparator 121 and first counter 123 generates the impedance to meet the first reference voltage Vref for the external resistance RQ. The output of the second detector 140 of the pull-down circuit is fed back with the impedance and accordingly generates the signal. The signal generated in the pull-up circuit and pull-down circuit is transmitted to the up-terminator 159 and down-terminator 161.

The operation of the programmable impedance control circuit according to the first embodiment of the present invention is explained as an example. In the case where a ×5 resistance is applied in the external and a ×4 impedance needs to be applied in the internal, the reference voltage is applied as (5/9)VDDQ voltage. In this case, because the practical voltage for driving the terminator or driver comes to VDDQ/2 and the practical voltage applied to the first MOS array 101 is (4/9)VDDQ, an operational error may be generated. However, if the linearity of the first MOS array 101 is sufficient, such an error does not cause any problem in the operation. In addition, if the HSTL level gradually decreases and the VDDQ level is accordingly lowered, the operation error also decreases.

Next, the operation of the programmable impedance control circuit for generating an optional reference voltage by an analog method according to the second embodiment of the present invention is explained in detail with reference to FIG. 8.

Figure 8:
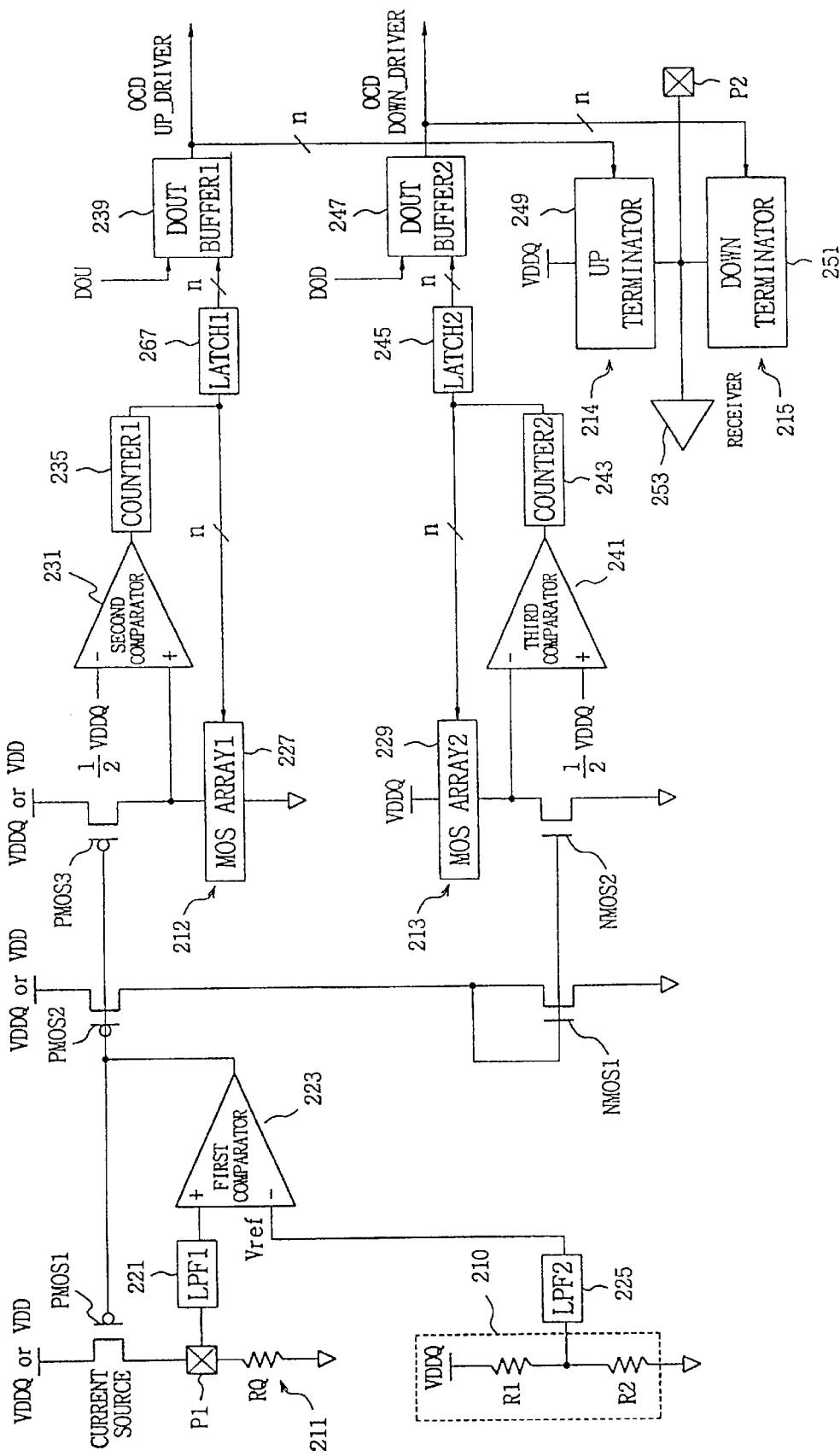
FIG. 8 is a schematic of a programmable impedance control circuit employing an optional reference voltage according to the second embodiment of the present invention.

FIG. 8 is a schematic of another embodiment of the invention. In this circuit, when a current source is used as a detecting circuit and a reference voltage is adopted as (5/8)VDDQ, the flowing current is the same as when the VDDQ/2 voltage is connected to a ×4 external resistance. A current source PMOS1 is supplied with VDDQ or VDD voltage. The circuit does not become responsive to noises in the pad P1 because of the PMOS1. The external resistance RQ has an N times the external impedance. The pad P1 outputs the voltage obtained in combination of the PMOS1 and the external resistance RQ. The first reference voltage generator 210 generates the reference voltage corresponding to N/(N+M) times VDDQ. The first comparator 223 compares the output voltage from the pad P1 with the first reference voltage Vref to change an impedance corresponding to the first reference voltage for the output voltage of the pad P1 to a current and at the same time feeding back it to PMOS1. The current mirror copies the current from the first comparator 223 in order to reduce the up/down miss-match. The second comparator 231 compares the output voltage from the current mirror with the voltage VDDQ/2 and outputs a signal to the first counter 235. The first counter 235 generates a signal in response to the output from the second comparator 232 and outputs it to the up-driver and up-terminator 249 of the off-chip driver, simultaneously feeding the signal back to the first MOS array 227 placed between the output of the current mirror and ground. The output of the first counter 235 is outputted to the off-chip up-driver OCD UP_DRIVER and up-terminator 249 through the first latch 267 and first data output buffer 239.

The aforementioned structure is the pull-up circuit. The corresponding pull-down circuit is as follows.

The second MOS array 229 is supplied with the VDDQ voltage. The second NMOS transistor NMOS2 is connected to the second MOS array 229 at its one terminal and to ground at the other terminal.

The third comparator 241 compares the output voltage obtained in combination of the second MOS array 229 and the NMOS2 with the VDDQ/2 voltage and outputs its signal to the second counter 243. The second counter 243 generates output to the down-driver and down-terminator 251. The output is also fed back to the second MOS array 229.

Low-pass filters LPFs 221, 225 are preferably connected between the output of the pad P1 and first comparator 223 and between the first reference voltage generator 210 and the first comparator 223, thereby reducing noises generated from the pad P1 and leveling up the noise characteristics. The reference voltage Vref of the first reference voltage generator 210 is outputted from between the first resistance R1 connected to the VDDQ voltage and the second resistance R2 connected to ground. The ratio of the first resistance R1 and second resistance R2 is M:N.

The operation of the programmable impedance control circuit according to the second embodiment of the present invention is explained as an example. In the case that the external resistance is ×N the external impedance and a ×M impedance needs to be applied in the internal, the reference voltage generator 210 generates the reference voltage [M/(N+M)]VDDQ. At this time, the voltage applied at the pad P1 and ground is [M/(N+M)]VDDQ. Then, the practical driving voltage is obtained when the node voltage becomes VDDQ/2. However, there is no difference in the current whether the voltage is VDDQ/2 or [M/(N+M)]VDDQ, because the PMOS1 is operated in a saturated region. The current generated in such a way is copied by the current mirror and allows the voltage difference at both terminals of the first MOS array 227 to become VDDQ/2 by changing the resistance value of the first MOS array 227. As a result, the ×M impedance is obtained at the state that the voltage difference between both terminals of the first MOS array 227 is VDDQ/2. The impedance value obtained in such a way meets the impedance of the up-driver. As a result, even though the ×N resistance is applied, the ×M impedance is realized minimizing a miss-matching operation.

Figure 9:
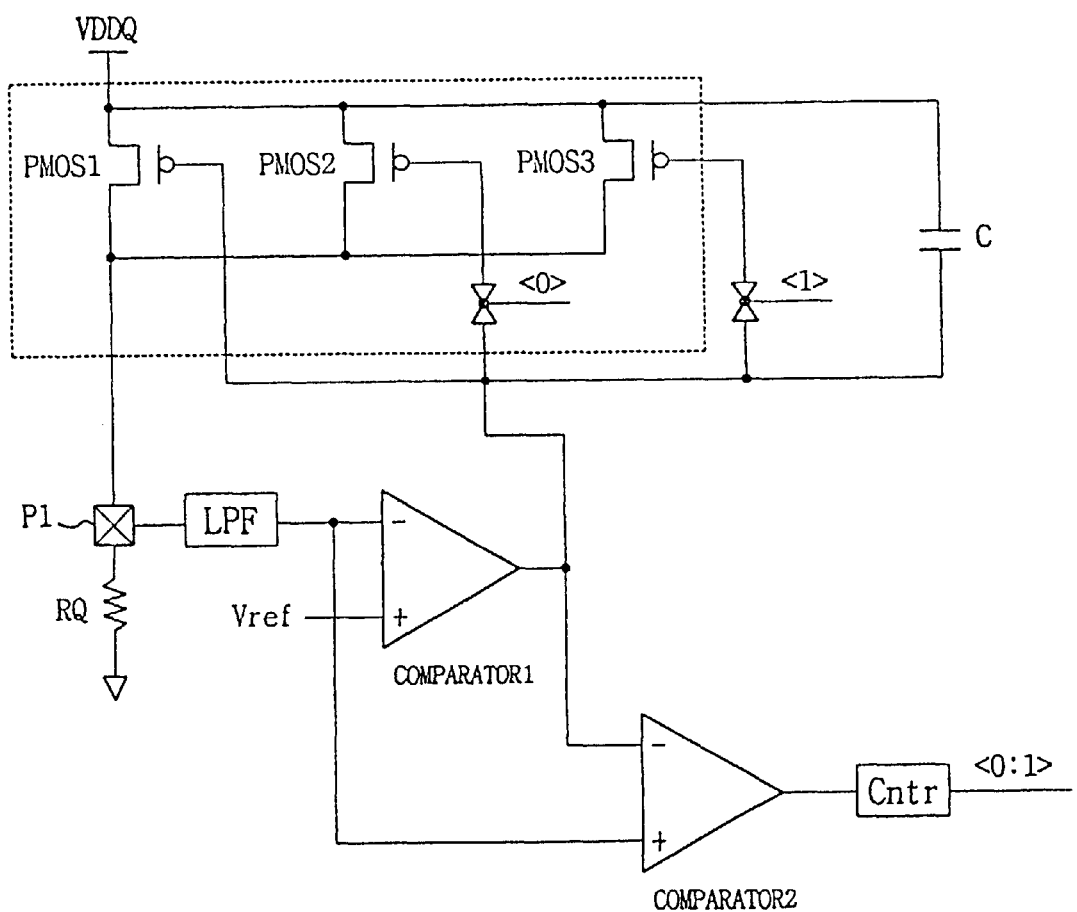
FIG. 9 is a schematic of a programmable impedance control circuit employing an optional reference voltage according to the third embodiment of the present invention.

FIG. 9 is a schematic according to another embodiment of the present invention. In this circuit, if the scope of the external resistance value is of wide range, just one PMOS current source cannot play a role of all the current sources. Accordingly, in order to meet such an environment, a circuit for controlling the operational scope of the programmable impedance control circuit is constructed as follows:

A current source comprises a plurality of PMOSs. In this figure, three PMOS's are shown, namely PMOS1, PMOS2, and PMOS3, though it is to be understood that there may be more as needed or desired. When the gate voltage of the turned-on PMOS1 reaches a drain voltage, the adjacent PMOS2 is turned-on, thereby extending the operational scope. A capacitor C between the gate and source of the PMOSs is preferably provided to minimize noises to the gate and source voltage Vgs in response to changes in current value caused by VDDQ voltage changes.

In light of the aforementioned descriptions, the present invention has advantages that the programmable impedance control circuit can generate an internal impedance in compliance with an external impedance although the required internal impedance in a chip is different from the external impedance. The circuit also employs a reference voltage for generating the internal impedance for the external impedance as an optional resistance value.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A programmable impedance control circuit, comprising:
   a MOS array for receiving a first voltage wherein the drain terminals of each MOS device of said MOS array are coupled together in signal communication with each other;
   an external resistance having an external impedance equal to N times said external resistance;
   a pad outputting a second voltage obtained by combination of said MOS array and said external resistance;
   a reference voltage generator for generating a third voltage corresponding to N/(N+M) times said first voltage as a reference voltage for said second voltage wherein M and N represent integer numbers; and
   wherein M times internal impedance is used for N times external impedance (N=M or N not equal to M);
   wherein the MOS array is constructed with a plurality of PMOSs and turn on an additionally adjacent PMOS when the turned-on PMOS gate voltage reaches a drain voltage; and
   wherein the MOS array includes a capacitance inserted between a gate and a source of the PMOSs.

2. A programmable impedance control circuit comprising:
   a MOS array for receiving a first voltage wherein the drain terminals of each MOS device of said MOS array are coupled together in signal communication with each other;
   an external resistance having an external impedance equal to N times said external resistance;
   a pad for providing a second voltage obtained by a combination of said MOS array and said external resistance;
   a reference voltage generator for generating a third voltage corresponding to N/(N+M) times said first voltage as a reference voltage for said second voltage wherein M and N represent integer numbers that need not be equal and M times internal impedance is used for N times external impedance;
   a detector adapted to detect an impedance corresponding to a reference voltage for the external resistance and provide a feedback signal to the MOS array by producing a current corresponding to an impedance of a reference voltage for an external resistance and at the same time feeding back the current to the MOS array; and
   a pull-up circuit for providing a current in response to a pull-down circuit by feeding back the current corresponding to the impedance generated by the detector of the pull-up circuit to produce a current corresponding to an impedance of the detector of the pull-down circuit.

3. The circuit as defined in claim 2, further comprising a current mirror to reduce at least one of an up and down mismatch of the pull-up circuit and the pull-down circuit.

4. A programmable impedance control circuit using an M times internal impedance for an N times external impedance wherein M and N represent integer numbers that need not be equal, the circuit comprising:
   a pull-up circuit comprising a MOS array for receiving a first voltage wherein the drain terminals of each MOS device of said MOS array are coupled together in signal communication with each other, an external resistance having an N times external impedance, a pad for providing a second voltage obtained by combination of the first MOS array and the external resistance, a first reference generator for generating a first reference voltage corresponding to N/(N+M) times the first voltage as a first reference voltage for the second voltage, a first comparator for comparing the second voltage with the first reference voltage to generate an impedance in compliance with the first reference voltage for the second voltage, and a first counter for generating a signal corresponding to the impedance from the first comparator to be provided to an up-driver and an up-terminator and to be fed back at the same time to the first MOS array; and
   a pull-down circuit comprising a second MOS array for receiving the first voltage and receiving the signal generated by the first counter to control an impedance, a third MOS array coupled in signal communication with the second MOS array at one terminal and coupled in signal communication with ground at the other terminal, a second comparator for comparing the third voltage obtained by a combination of the second MOS array and the third MOS array with the second reference voltage that is about half of the first voltage to generate an impedance in compliance with the second reference voltage for the third voltage, and a second counter for generating a signal corresponding to the impedance from the second comparator to be provided to a down-driver and down-terminator and to be fed back at the same time to the third MOS array.

5. The circuit as defined in claim 4 wherein the output of the pad and the input of the first comparator are provided therebetween with a low-pass filter, and the output of the first reference generator and the input of the first comparator are provided therebetween with a low-pass filter.

6. The circuit as defined in claim 5 wherein the first reference generator provides the first reference voltage from between a first resistance for receiving the first voltage and a second resistance coupled in signal communication with ground, wherein the ratio of the first resistance and the second resistance is M to N.

7. A programmable impedance control circuit using an M times internal impedance for an N times external impedance wherein M and N represent integer numbers that need not be equal, the circuit comprising:

a pull-up circuit comprising a PMOS current source for receiving at least one of a first voltage and a second voltage wherein the drain terminals of each of a plurality of PMOS devices of said PMOS current source are coupled together in signal communication with each other, an external resistance having an N times external impedance, a pad for providing a third voltage obtained by combination of the PMOS current source and the external resistance, a first reference generator for generating a fourth voltage as a first reference voltage corresponding to N/(N+M) times the first voltage for the third voltage from the pad, a first comparator for comparing the third voltage with the fourth voltage generate a current indicative of an impedance in compliance with the first reference voltage for the third voltage and at the same time feed back the current to the PMOS, a current mirror for copying the current from the first comparator, a second comparator for comparing the output voltage from the current mirror with a second reference voltage that is about half of the first voltage, and a first counter for generating a signal corresponding to the impedance indicated by the second comparator and providing the signal to an up-driver and up-terminator and at the same time feeding the signal back to the first MOS array; and a pull-down circuit comprising a second MOS array for receiving the first voltage, an NMOS array coupled in signal communication with the second MOS array at one terminal and coupled in signal communication with ground at the other terminal, a third comparator for comparing a fifth voltage obtained by combination of the second MOS array and the NMOS array with the second reference voltage to indicate an impedance in compliance the second reference voltage for the fifth voltage, and a second counter for generating a signal corresponding to the impedance indicated by the third comparator and providing the signal to a down-driver and down-terminator at the same time as feeding the signal back to the second MOS array.

8. The circuit as defined in claim 7 wherein the output of the pad and the input of the first comparator are provided therebetween with a low-pass filter, and the output of the first reference generator and the input of the first comparator are provided therebetween with a low-pass filter.

9. The circuit as defined in claim 8 wherein the first reference generator provides the fourth voltage from between a first resistance for receiving the first voltage and a second resistance coupled in signal communication with ground, wherein the ratio of the first resistance and the second resistance is M to N.

10. The circuit as defined in claim 9 wherein the current source comprises a plurality of PMOS devices, each PMOS device adapted for activating an additionally adjacent PMOS device when the gate voltage of the PMOS device reaches a drain voltage to thereby extend the operational scope of the circuit.

11. The circuit as defined in claim 10 wherein the current source is provided therein with a capacitor inserted between the gate and source terminals of at least one of the PMOS devices.

* * * * *